United States Patent
Nakao et al.

(10) Patent No.: US 6,239,462 B1
(45) Date of Patent: May 29, 2001

(54) SEMICONDUCTOR CAPACITIVE DEVICE HAVING IMPROVED ANTI-DIFFUSION PROPERTIES AND A METHOD OF MAKING THE SAME

(75) Inventors: Keisaku Nakao, Kyoto; Akihiro Matsuda, Osaka; Yasufumi Izutsu, Kyoto; Toyoji Ito, Shiga; Takumi Mikawa; Toru Nasu, both of Kyoto; Yoshihisa Nagano, Osaka; Keisuke Tanaka, Shiga; Toshie Kutsunai, Osaka, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/120,893

(22) Filed: Jul. 23, 1998

(30) Foreign Application Priority Data

Jul. 24, 1997 (JP) .................................................. 9-198118
Jul. 24, 1997 (JP) .................................................. 9-198119

(51) Int. Cl.$^7$ ......................... H01L 27/108; H01L 29/76; H01L 29/94; H01L 31/119; H01L 29/40
(52) U.S. Cl. ......................... 257/310; 257/295; 257/296; 257/309; 257/758
(58) Field of Search ................................... 257/295, 310, 257/306, 303, 305, 298, 758

(56) References Cited

U.S. PATENT DOCUMENTS

| | | | |
|---|---|---|---|
| 5,216,572 | * 6/1993 | Larson et al. ......................... 361/313 |
| 5,366,920 | 11/1994 | Yamamichi et al. . | |
| 5,396,095 | 3/1995 | Wolters et al. . | |
| 5,580,814 | * 12/1996 | Larson ..................................... 437/52 |
| 5,591,663 | 1/1997 | Nasu et al. . | |
| 5,627,391 | * 5/1997 | Shimada et al. ....................... 257/310 |
| 6,022,669 | * 2/2000 | Uchida et al. ......................... 430/313 |
| 6,046,469 | * 4/2000 | Yamazaki et al. .................... 257/306 |

FOREIGN PATENT DOCUMENTS

| | | |
|---|---|---|
| 0404295 | 12/1990 | (EP) . |
| 0448151 | 9/1991 | (EP) . |
| 0574275 | 12/1993 | (EP) . |
| 06120072 | 4/1992 | (JP) . |
| 08017759 | 1/1996 | (JP) . |
| 08236719 | 9/1996 | (JP) . |
| 08288239 | 11/1996 | (JP) . |
| 08306722 | 11/1996 | (JP) . |
| 8-264481 | 11/1996 | (JP) . |
| 09045877 | 2/1997 | (JP) . |
| 09082907 | 3/1997 | (JP) . |
| 09097883 | 4/1997 | (JP) . |

* cited by examiner

Primary Examiner—Jerome Jackson, Jr.
Assistant Examiner—Jesse A. Fenty
(74) Attorney, Agent, or Firm—McDermott, Will & Emery

(57) ABSTRACT

The semiconductor device of the invention includes a capacitor device, which is formed on a substrate and which includes a capacitive lower electrode, a capacitive insulating film made of an insulating metal oxide film and a capacitive upper electrode. An interlevel insulating film having an opening reaching the capacitive upper electrode is formed over the capacitor device. A metal interconnection including a titanium film is formed over the interlevel insulating film so as to be electrically connected to the capacitive upper electrode through the opening. An anti-diffusion film having conductivity is formed between the capacitive upper electrode and the metal interconnection for preventing titanium atoms composing the titanium film of the metal interconnection from passing through the capacitive upper electrode and diffusing into the capacitive insulating film.

5 Claims, 14 Drawing Sheets

SEMICONDUCTOR CAPACITIVE DEVICE HAVING IMPROVED ANTI-DIFFUSION PROPERTIES AND A METHOD OF MAKING THE SAME

BACKGROUND OF THE INVENTION

The present invention generally relates to a semiconductor device and a method for fabricating the same. More particularly, the present invention relates to a semiconductor device including a capacitor device having a capacitive insulating film of insulating metal oxide film such as a ferroelectric film or a high dielectric film (i.e., a film made of a material having a high dielectric constant) and to a method for fabricating the same.

In recent years, as various electronic units such as microcomputers operating at an even higher speed and with even lower power consumption have been developed, the performance of consumer-use electronic units have also been further enhanced. Correspondingly, the sizes of semiconductor devices used for these units have also been rapidly reduced drastically.

As semiconductor devices have been miniaturized, unwanted radiation, i.e., electromagnetic wave noise generated from electronic units, has become a serious problem. Technology for incorporating a large-capacity capacitor device, including a ferroelectric film or a high dielectric film as a capacitive insulating film, into a semiconductor integrated circuit is now the object of much attention as a means for reducing the unwanted radiation.

On the other hand, since a very highly integrated dynamic RAM is now provided, researches have been widely carried out on technology for using a high dielectric film as a capacitive insulating film, instead of a silicon oxide film or a silicon nitride film, which has been conventionally used.

Furthermore, in order to put into practical use a nonvolatile RAM operating with a low voltage and enabling high-speed write and read operations, researches and developments have also been vigorously carried out on a ferroelectric film having spontaneous polarization properties. A ferroelectric memory using a ferroelectric film as a capacitive insulating film takes advantage of a phenomenon that the amount of charge flowing into/out of a data line of a ferroelectric memory differs depending upon whether or not the spontaneous polarization of the ferroelectric film is inverted.

In all of these types of semiconductor devices mentioned above, it is an urgent task to develop technology for realizing very high integration for a capacitor device without deteriorating the characteristics thereof.

Hereinafter, a conventional semiconductor device will be described with reference to FIG. 13.

FIG. 13 illustrates a cross-sectional structure of a conventional semiconductor device. As shown in FIG. 13, a lower electrode 2 made of a first platinum film, a capacitive insulating film 3 made of a ferroelectric film and an upper electrode 4 made of a second platinum film are formed in this order on a semiconductor substrate 1 made of silicon. The lower electrode 2, the capacitive insulating film 3 and the upper electrode 4 constitute a capacitor device. An interlevel insulating film 5 made of a silicon oxide film, a silicon nitride film or the like is deposited to cover the entire surface of the semiconductor substrate 1 as well as the capacitor device. A lower-electrode contact hole 6 and an upper-electrode contact hole 7 are formed through the interlevel insulating film 5. Metal interconnections 8, each consisting of a titanium film 8a, a first titanium nitride film 8b, an aluminum film 8c and a second titanium nitride film 8d, are formed to cover the interlevel insulating film 5 as well as the inner surfaces of the lower-electrode contact hole 6 and the upper-electrode contact hole 7.

Hereinafter, a method for fabricating the conventional semiconductor device will be described with reference to FIGS. 14(a) through 14(e).

First, as shown in FIG. 14(a), the first platinum film 2A, the ferroelectric film 3A and the second platinum film 4A are sequentially stacked over the entire surface of the semiconductor substrate 1. Thereafter, as shown in FIG. 14(b), the second platinum film 4A is selectively etched, thereby forming the upper electrode 4. Then, in order to recover and stabilize the crystal structure of the ferroelectric film 3A, the ferroelectric film 3A is subjected to a heat treatment within oxygen ambient.

Next, as shown in FIG. 14(c), the ferroelectric film 3A and the first platinum film 2A are selectively etched, thereby forming the capacitive insulating film 3 out of the ferroelectric film 3A and the lower electrode 2 out of the first platinum film 2A. Then, in order to recover and stabilize the crystal structure of the ferroelectric film constituting the capacitive insulating film 3, the capacitive insulating film 3 is subjected to a heat treatment within oxygen ambient.

Subsequently, as shown in FIG. 14(d), the interlevel insulating film 5 made of a silicon oxide film or a silicon nitride film is deposited over the entire surface of the semi-conductor substrate 1. And the lower-electrode contact hole 6 and the upper-electrode contact hole 7 are formed through the interlevel insulating film 5. Then, in order to recover and stabilize the crystal structure of the ferroelectric film constituting the capacitive insulating film 3, the capacitive insulating film 3 is subjected to a heat treatment within oxygen ambient.

In order to prevent the lower electrode 2 or the upper electrode 4 from being oxidized as a result of the reaction between the lower electrode 2 or the upper electrode 4 with the capacitive insulating film 3 during the heat treatment conducted to recover and stabilize the crystal structure of the ferroelectric film, the lower and the upper electrodes 2, 4 are made of platinum, which is hard to react with the ferroelectric film 3A constituting the capacitive insulating film 3 during the heat treatment and exhibits anti-oxidation properties even at a high temperature.

Then, as shown in FIG. 14(e), the titanium film 8a, the first titanium nitride film 8b, the aluminum film 8c and the second titanium nitride film 8d are sequentially deposited to cover the entire surface of the semiconductor substrate 1 as well as the inner surfaces of the lower-electrode contact hole 6 and the upper-electrode contact hole 7, thereby forming the metal interconnections 8, each consisting of the titanium film 8a, the first titanium nitride film 8b, the aluminum film 8c and the second titanium nitride film 8d. The titanium film 8a functions as an adhesive film for improving the adhesion between the aluminum film 8c and the platinum film constituting the upper electrode 4. The first titanium nitride film 8b functions as a barrier film for preventing aluminum in the aluminum film 8c from diffusing into the capacitive insulating film 3. The second titanium nitride film 8d functions as an anti-reflection film while an upper inter level insulating film deposited over the metal interconnections 8 is etched.

Next, in order to further improve the adhesion between the titanium film 8a constituting the metal interconnections 8 and the interlevel insulating film 5, the metal interconnections 8 are subjected to a heat treatment.

However, during the heat treatment conducted to stabilize the crystal structure of the ferroelectric film, the platinum film constituting the upper electrode comes to have column like crystal structure. Thus, during the heat treatment conducted to improve the adhesion between the metal interconnections and the interlevel insulating film, the titanium atoms in the titanium film constituting the metal interconnections adversely pass through the grain boundary of the column like crystals of the platinum film constituting the upper electrode so as to diffuse into the capacitive insulating film. As a result, since the composition of the ferroelectric film or the high dielectric film constituting the capacitive insulating film is varied, the electrical characteristics of the capacitor device are disadvantageously deteriorated.

It is not only when the upper electrode is made of platinum but also when the upper electrode is made of iridium, ruthenium, rhodium, palladium or the like that the upper electrode ordinarily has a column like crystal structure. Thus, in the latter case, the titanium atoms in the titanium film constituting the metal interconnections also adversely pass through the grain boundary of the column like crystals constituting the upper electrode so as to diffuse into the capacitive insulating film.

SUMMARY OF THE INVENTION

In view of the foregoing, the object of the present invention is to prevent titanium atoms in a titanium film from passing through the grain boundary of metal crystals composing the upper electrode of a capacitor device and diffusing into a capacitive insulating film during a heat treatment conducted on metal interconnections, which are formed on the capacitor device and include the titanium film.

In order to accomplish the object, the semiconductor device according to the present invention includes: a substrate; a capacitor device, which is formed on the substrate and includes a capacitive lower electrode, a capacitive insulating film made of an insulating metal oxide film and a capacitive upper electrode; an interlevel insulating film, which is formed on the capacitor device and has an opening reaching the capacitive upper electrode; a metal interconnection, which is formed on the interlevel insulating film so as to be electrically connected to the capacitive upper electrode through the opening and includes a titanium film; and an anti-diffusion film, which is formed between the capacitive upper electrode and the metal interconnection, has conductivity and prevents titanium atoms composing the titanium film of the metal interconnection from passing through the capacitive upper electrode and diffusing into the capacitive insulating film.

In the semiconductor device of the present invention, an anti-diffusion film for preventing titanium atoms composing the titanium film of the metal interconnection from passing through the capacitive upper electrode and diffusing into the capacitive insulating film is formed between the capacitive upper electrode and the metal interconnection. Thus, during the heat treatment on the metal interconnection, the titanium atoms in the titanium film do not pass through the grain boundary of metal crystals composing the capacitive upper electrode and do not diffuse into the capacitive insulating film. Accordingly, a semiconductor device including a highly reliable capacitor device can be formed.

In the semiconductor device of the present invention, the anti-diffusion film is preferably a metal nitride film or metal oxide film having conductivity.

In such an embodiment, since the conductive metal nitride film or metal oxide film has no grain boundary and has a dense structure, the film can prevent the passage of titanium atoms with certainty. In particular, if the anti-diffusion film is a conductive metal oxide film, the conductivity of the film is not damaged even when a heat treatment is conducted within oxygen ambient in order to recover the crystal structure of the ferroelectric film constituting the capacitive insulating film. This is because the metal oxide film has conductivity in the state of an oxide.

In the semiconductor device of the present invention, if the capacitive insulating film is a ferroelectric film, a highly reliable nonvolatile memory can be obtained. On the other hand, if the capacitive insulating film is a high dielectric film, a highly reliable dynamic memory can be obtained.

In the semiconductor device of the present invention, the titanium film is preferably an adhesive layer, formed as a lowermost layer of the metal interconnection, for improving adhesion between the metal interconnection and the upper electrode, and the anti-diffusion film is preferably a titanium nitride film.

In such an embodiment, since the titanium film is an adhesive layer, the adhesion between the metal interconnection and the upper electrode can be improved. In addition, if the anti-diffusion film is a titanium nitride film, then no by-product is formed during the deposition of the anti-diffusion film. Moreover, even if titanium in the titanium film diffuses toward the anti-diffusion film over a certain distance, the nature of the anti-diffusion film is not changed and the characteristics of the capacitor device are stabilized.

In the semiconductor device of the present invention, the capacitive upper electrode preferably has a crystal structure including a grain boundary.

In such an embodiment, although the titanium atoms are more likely to pass through the capacitive upper electrode, the titanium atoms do not diffuse into the capacitive insulating film because the atoms are prevented by the anti-diffusion film from reaching the capacitive upper electrode.

A first method for fabricating a semiconductor device according to the present invention includes the steps of: forming a capacitor device, including a capacitive lower electrode, a capacitive insulating film made of an insulating metal oxide film and a capacitive upper electrode, on a substrate; forming an interlevel insulating film, having a contact hole reaching the capacitive upper electrode, on the capacitor device; depositing a conductive film, preventing the passage of titanium atoms therethrough, so as to cover the entire surface of the interlevel insulating film as well as the contact hole; patterning the conductive film such that at least a part of the conductive film located inside the contact hole is left, thereby forming an anti-diffusion film out of the conductive film; and forming, on the interlevel insulating film, a metal interconnection including a titanium film such that the metal interconnection is electrically connected to the capacitive upper electrode via the anti-diffusion film.

In the first method for fabricating a semiconductor device, a conductive film, preventing the passage of titanium atoms, is deposited over an interlevel insulating film formed on the capacitor device and including a contact hole. Then, the conductive film is patterned, thereby leaving the part of the conductive film located inside the contact hole. Thus, the anti-diffusion film for preventing the titanium atoms from passing through the capacitive upper electrode and diffusing into the capacitive insulating film can be formed between the upper electrode of the capacitor device and the metal interconnection with certainty.

A second method for fabricating a semiconductor device according to the present invention, includes the steps of:

forming a capacitor device, including a capacitive lower electrode, a capacitive insulating film made of an insulating metal oxide film and a capacitive upper electrode, on a substrate; forming an interlevel insulating film, having a contact hole reaching the capacitive upper electrode, on the capacitor device; forming, on the interlevel insulating film, a resist pattern having an opening at a site corresponding to the contact hole; depositing a conductive film, preventing the passage of titanium atoms therethrough, so as to cover the entire surface of the resist pattern; lifting off the conductive film together with the resist pattern such that a part of the conductive film located inside the contact hole is left, thereby forming an anti-diffusion film out of the conductive film; and forming, on the interlevel insulating film, a metal interconnection including a titanium film such that the metal interconnection is electrically connected to the capacitive upper electrode via the anti-diffusion film.

In the second method for fabricating a semiconductor device, a resist pattern having an opening at a site corresponding to a contact hole is formed on the interlevel insulating film formed on the capacitor device and including the contact hole, and a conductive film, preventing the passage of titanium atoms therethrough, is deposited thereon. Thus, the anti-diffusion film for preventing the titanium atoms from passing through the capacitive upper electrode and diffusing into the capacitive insulating film can be formed between the upper electrode of the capacitor device and the metal interconnection with certainty.

A third method for fabricating a semiconductor device according to the present invention includes the steps of: sequentially stacking a first metal film, an insulating metal oxide film, a second metal film and a conductive film, preventing the passage of titanium atoms therethrough, on a substrate; patterning the second metal film and the conductive film by using the same etching mask, thereby forming a capacitive upper electrode out of the second metal film and an anti-diffusion film out of the conductive film; patterning the insulating metal oxide film to form a capacitive insulating film and patterning the first metal film to form a capacitive lower electrode; forming an interlevel insulating film, having a contact hole reaching the capacitive upper electrode, over a capacitor device constituted by the capacitive lower electrode, the capacitive insulating film and the capacitive upper electrode; and forming, on the interlevel insulating film, a metal interconnection including a titanium film such that the metal interconnection is electrically connected to the capacitive upper electrode via the anti-diffusion film.

In the third method for fabricating a semiconductor device, among the sequentially stacked first metal film, insulating metal oxide film, second metal film and conductive film preventing the passage of titanium atoms therethrough, the second metal film and the conductive film are patterned first, thereby forming a capacitive upper electrode and an anti-diffusion film. Then, a metal interconnection including a titanium film is formed over the interlevel insulating film having a contact hole. Thus, the anti-diffusion film for preventing the titanium atoms from passing through the capacitive upper electrode and diffusing into the capacitive insulating film can be formed between the upper electrode of the capacitor device and the metal interconnection with certainty.

A fourth method for fabricating a semiconductor device according to the present invention includes the steps of: forming a capacitive lower electrode and a capacitive insulating film made of an insulating metal oxide film on a substrate; depositing an interlevel insulating film so as to cover the substrate as well as the capacitive insulating film; forming a resist pattern over the interlevel insulating film, the resist pattern having an opening over a region where a capacitive upper electrode is to be formed; etching the interlevel insulating film by using the resist pattern as a mask, thereby forming an upper electrode forming opening through the interlevel insulating film; sequentially depositing a metal film and a conductive film preventing the passage of titanium atoms therethrough so as to cover the entire surface of the resist pattern as well as the upper electrode forming opening; lifting off the metal film and the conductive film together with the resist pattern such that part of the metal film and part of the conductive film, which are located in the upper electrode forming opening, are left, thereby forming the capacitive upper electrode out of the metal film and an anti-diffusion film out of the conductive film; and forming, on the interlevel insulating film, a metal interconnection including a titanium film such that the metal interconnection is electrically connected to the capacitive upper electrode via the anti-diffusion film.

In the fourth method for fabricating a semiconductor device, the interlevel insulating film is etched by using, as a mask, a resist pattern including an opening over the region where the capacitive upper electrode is to be formed, thereby forming an upper electrode forming opening through the interlevel insulating film. Then, a metal film and a conductive film preventing the passage of titanium atoms therethrough are deposited, and a metal interconnection including a titanium film is formed thereon. Thus, the anti-diffusion film for preventing the titanium atoms from passing through the capacitive upper electrode and diffusing into the capacitive insulating film can be formed between the upper electrode of the capacitor device and the metal interconnection with certainty.

Therefore, in accordance with the first to fourth methods for fabricating a semiconductor device, the semiconductor device of the present invention can be fabricated with certainty.

In the first to fourth methods for fabricating a semiconductor device, the conductive film is preferably a metal nitride film or metal oxide film having conductivity.

In the first to fourth methods for fabricating a semiconductor device, the capacitive insulating film is preferably a ferroelectric film or a high dielectric film.

In the first to fourth methods for fabricating a semiconductor device, the titanium film is preferably an adhesive layer, formed as a lowermost layer of the metal interconnection, for improving adhesion between the metal interconnection and the capacitive upper electrode, and the anti-diffusion film is preferably a titanium nitride film.

In the first to fourth methods for fabricating a semiconductor device, the capacitive upper electrode preferably has a crystal structure including a grain boundary.

DESCRIPTION OF THE PREFERRED EMBODIMENTS

Embodiment 1

Hereinafter, a semiconductor device according to the first embodiment of the present invention will be described with reference to FIG. 1.

Figure 1:
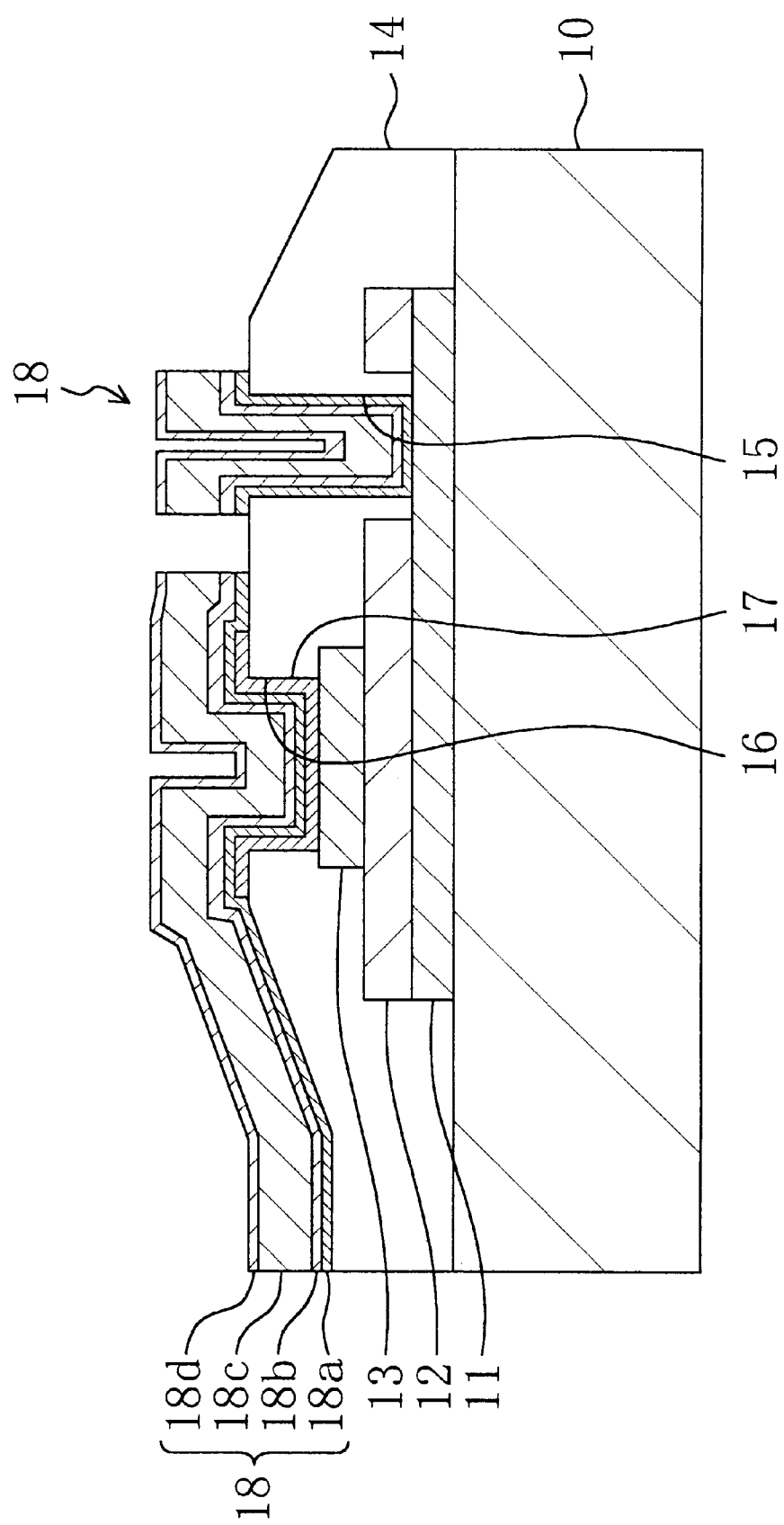
FIG. 1 is a cross-sectional view of a semiconductor device in the first embodiment of the present invention.

FIG. 1 illustrates a cross-sectional structure of the semiconductor device in the first embodiment. As shown in FIG. 1, a lower electrode 11 made of a first platinum film, a capacitive insulating film 12 made of an insulating metal oxide film such as a ferroelectric film or a high dielectric film, and an upper electrode 13 made of a second platinum film are sequentially formed on a semiconductor substrate 10 made of silicon. The lower electrode 11, the capacitive insulating film 12 and the upper electrode 13 constitute a capacitor device. In this embodiment, the size of the lower electrode 11 is larger than that of the upper electrode 13 such that a metal interconnection can be extended upward to pass by the sides of the upper electrode 13 and be electrically connected to the lower electrode 11.

An interlevel insulating film 14 made of a silicon oxide film, for example, is deposited to cover the entire surface of the semiconductor substrate 10 as well as the capacitor device. A lower-electrode contact hole 15 and an upper-electrode contact hole 16 are formed through the interlevel insulating film 14.

The first embodiment is characterized by including an anti-diffusion conductive film 17 made of a conductive metal nitride film (e.g., a titanium nitride film) on the inner bottom surface and inner wall surfaces of the upper-electrode contact hole 16 and on a part of the interlevel insulating film 14 surrounding the upper-electrode contact hole 16.

Metal interconnections 18, each consisting of a titanium film 18a, a first titanium nitride film 18b, an aluminum film 18c and a second titanium nitride film 18d, are formed over the interlevel insulating film 14 as well as the inner surfaces of the lower-electrode contact hole 15 and the upper-electrode contact hole 16. In this embodiment, one of the metal interconnections 18 is electrically connected to the lower electrode 11 directly inside the lower-electrode contact hole 15. The other metal interconnection 18 is electrically connected to the upper electrode 13 via the anti-diffusion conductive film 17 inside the upper-electrode contact hole 16.

It is noted that the titanium film 18a functions as an adhesive layer for improving the adhesion between the aluminum film 18c and the lower electrode 11 and between the aluminum film 18c and the upper electrode 13. The first titanium nitride film 18b functions as a barrier layer for preventing aluminum in the aluminum film 18c from diffusing into the capacitive insulating film 12. The second titanium nitride film 18d functions as an anti-reflection film while an upper interlevel insulating film to be deposited on the metal interconnections 18 is etched.

Hereinafter, a method for fabricating the semiconductor device in the first embodiment of the present invention will be described with reference to FIGS. 6(a) through 6(c) and FIGS. 7(a) through 7(c).

Figure 6A:
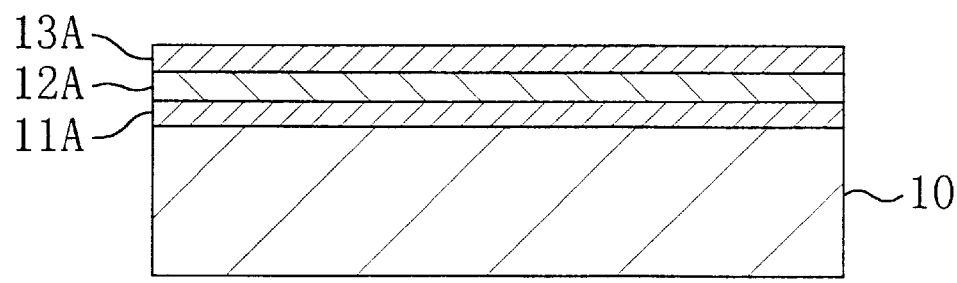
FIGS. 6(a) through 6(c) are cross-sectional views illustrating respective process steps in a method for fabricating the semiconductor device of the first embodiment of the present invention.

First, as shown in FIG. 6(a), the first platinum film 11A, the ferroelectric film 12A and the second platinum film 13A are sequentially stacked over the entire surface of the semiconductor substrate 10.

Figure 6B:
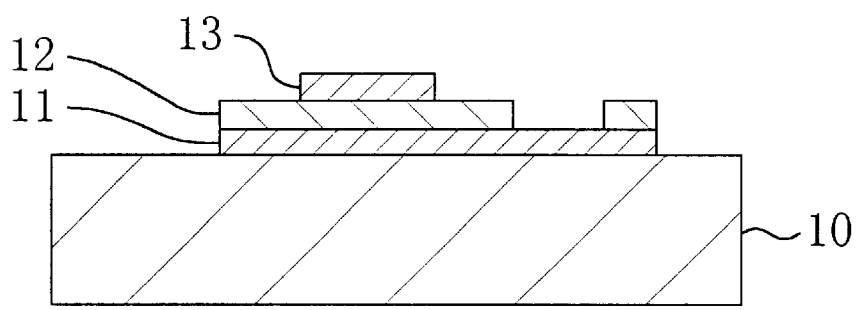

Thereafter, as shown in FIG. 6(b), the second platinum film 13A is selectively etched, thereby forming the upper electrode 13. Then, the ferroelectric film 12A and the first platinum film 11A are selectively etched, thereby forming the capacitive insulating film 12 out of the ferroelectric film 12A and the lower electrode 11 out of the first platinum film 11A. In this embodiment, the ferroelectric film 12A and the first platinum film 11A are preferably etched by using the same mask, because mask misalignment can be prevented by doing so. Alternatively, the ferroelectric film 12A and the first platinum film 11A may be etched separately by using respectively different masks. Then, the capacitive insulating film 12 is selectively etched in order to form a region from which a metal interconnection to be electrically connected to the lower electrode 11 is extended upward. Subsequently, in order to recover and stabilize the crystal structure of the ferroelectric film constituting the capacitive insulating film 12, the capacitive insulating film 12 is subjected to a heat treatment within oxygen ambient.

Figure 6C:
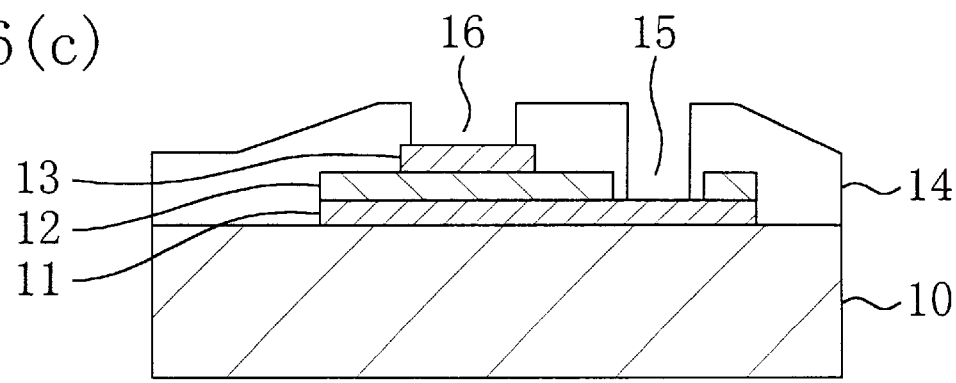

Next, as shown in FIG. 6(c), the interlevel insulating film 14 made of a silicon oxide film is deposited over the entire surface of the semiconductor substrate 10. And the interlevel insulating film 14 is selectively etched, thereby forming the lower-electrode contact hole 15 and the upper-electrode contact hole 16. Then, in order to recover and stabilize the crystal structure of the ferroelectric film constituting the capacitive insulating film 12, the capacitive insulating film 12 is subjected to a heat treatment within oxygen ambient.

Figure 7A:
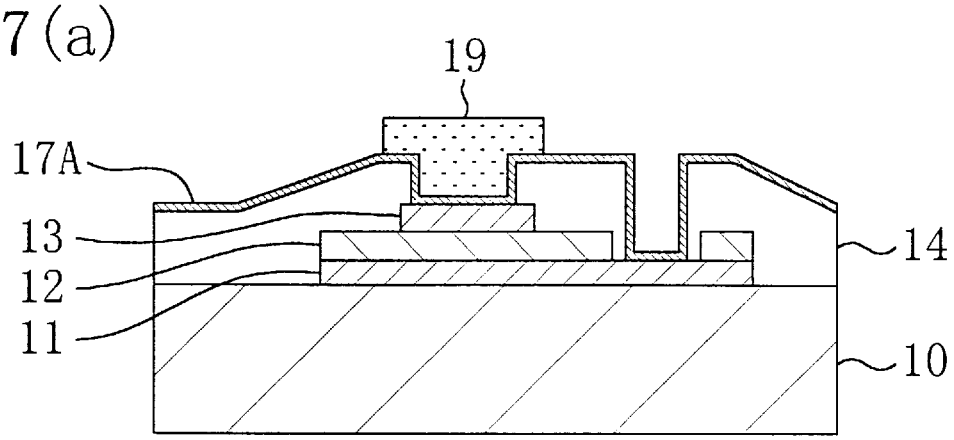
FIGS. 7(a) through 7(c) are cross-sectional views illustrating respective process steps in the method for fabricating the semiconductor device of the first embodiment of the present invention.

Next, as shown in FIG. 7(a), the titanium nitride film 17A is deposited so as to cover the entire surface of the semiconductor substrate 10 as well as the inner surfaces of the lower-electrode contact hole 15 and the upper-electrode contact hole 16. Then, a resist pattern 19 having an opening over the upper-electrode contact hole 16 and the surrounding region thereof is formed over the titanium nitride film 17A.

Figure 7B:
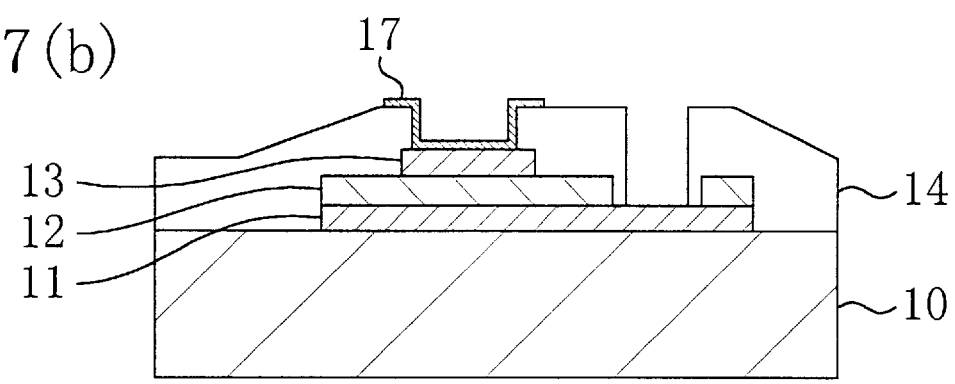

Subsequently, as shown in FIG. 7(b), the titanium nitride film 17A is etched by using the resist pattern 19 as a mask, thereby forming the anti-diffusion conductive film 17 out of the titanium nitride film 17A so as to cover the inner bottom surface and inner wall surfaces of the upper-electrode contact hole 16 and part of the upper surface of the interlevel insulating film 14 surrounding the upper-electrode contact hole 16.

Figure 7C:
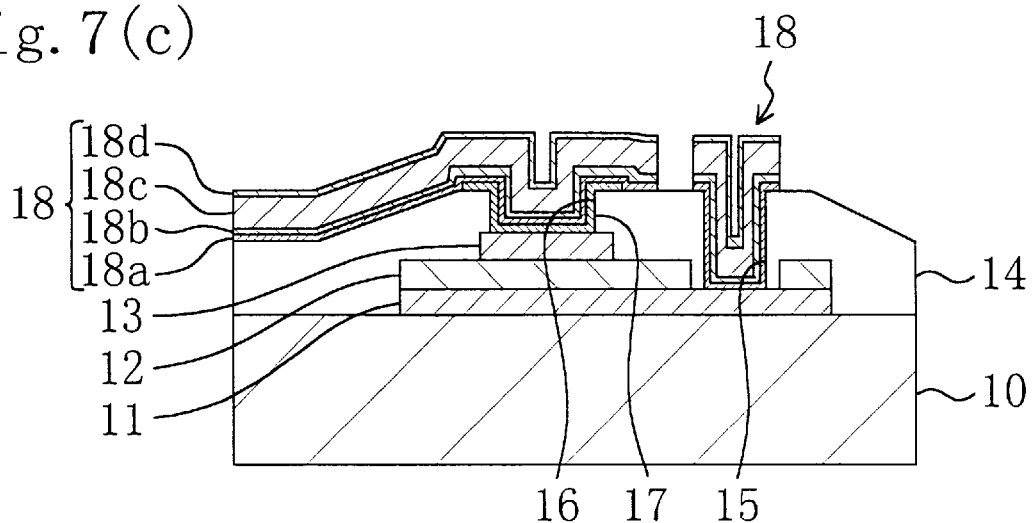

Then, as shown in FIG. 7(c), the metal interconnections 18, each consisting of the titanium film 18a, the first titanium nitride film 18b, the aluminum film 18c and the second titanium nitride film 18d, are formed over the anti-diffusion conductive film 17 and the interlevel insulating film 14. The titanium film 18a functions as an adhesive layer for improving the adhesion between the aluminum film 18c and the lower electrode 11 and between the aluminum film 18c and the upper electrode 13. The first titanium nitride film 18b functions as a barrier layer for preventing aluminum in the aluminum film 18c from diffusing into the capacitive insulating film 12. The second titanium nitride film 18d functions as an anti-reflection film while an upper interlevel insulating film to be deposited over the metal interconnections 18 is etched.

Next, in order to further improve the adhesion between the titanium film 18a constituting the metal interconnections 18 and the interlevel insulating film 14, the metal interconnections 18 are subjected to a heat treatment.

In the first embodiment, the inner bottom surface and inner wall surfaces of the upper-electrode contact hole 16 and the part of the upper surface of the interlevel insulating film 14 surrounding the upper-electrode contact hole 16 are covered with the anti-diffusion conductive film 17 made of the titanium nitride film 17A including no grain boundaries and having a dense structure. Thus, the titanium atoms in the titanium film 18a constituting the metal interconnections 18 do not pass through the anti-diffusion conductive film 17. Accordingly, during the heat treatment conducted on the metal interconnections 18, it is possible to prevent the titanium atoms in the titanium film 18a from passing through the grain boundaries of metal crystals composing the upper electrode 13 and diffusing into the capacitive insulating film 12. As a result, in the first embodiment, a semiconductor device including a highly reliable capacitor device can be formed.

In addition, in the first embodiment, not only the inner surfaces of the upper-electrode contact hole 16 but also the part of the upper surface of the interlevel insulating film 14 surrounding the upper-electrode contact hole 16 are covered with the anti-diffusion conductive film 17. Thus, even when a mask used for patterning the titanium nitride film 17A is out of alignment to a certain degree, the inner bottom surface of the upper-electrode contact hole 16 can be covered with the anti-diffusion conductive film 17 with certainty.

Hereinafter, the evaluation of the semiconductor device of the first embodiment will be described.

Table 1 shows in comparison the characteristics of the capacitor device in the semiconductor device of the first embodiment and the characteristics of a capacitor device in a conventional semiconductor device.

TABLE 1

| | Breakdown voltage (V) | Data retention time (years) |
|---|---|---|
| First Embodiment | 40 | 10 |
| Conventional Capacitor | 20 | 1 |

As can be understood from Table 1, in the first embodiment, the breakdown voltage of the capacitor device is 40 V, which is twice as high as that of the conventional capacitor device. The data retention time of the capacitor device of the first embodiment is 10 years, which is ten times as long as that of the conventional capacitor device.

Embodiment 2

Hereinafter, a semiconductor device according to the second embodiment of the present invention will be described with reference to FIG. 2.

Figure 2:
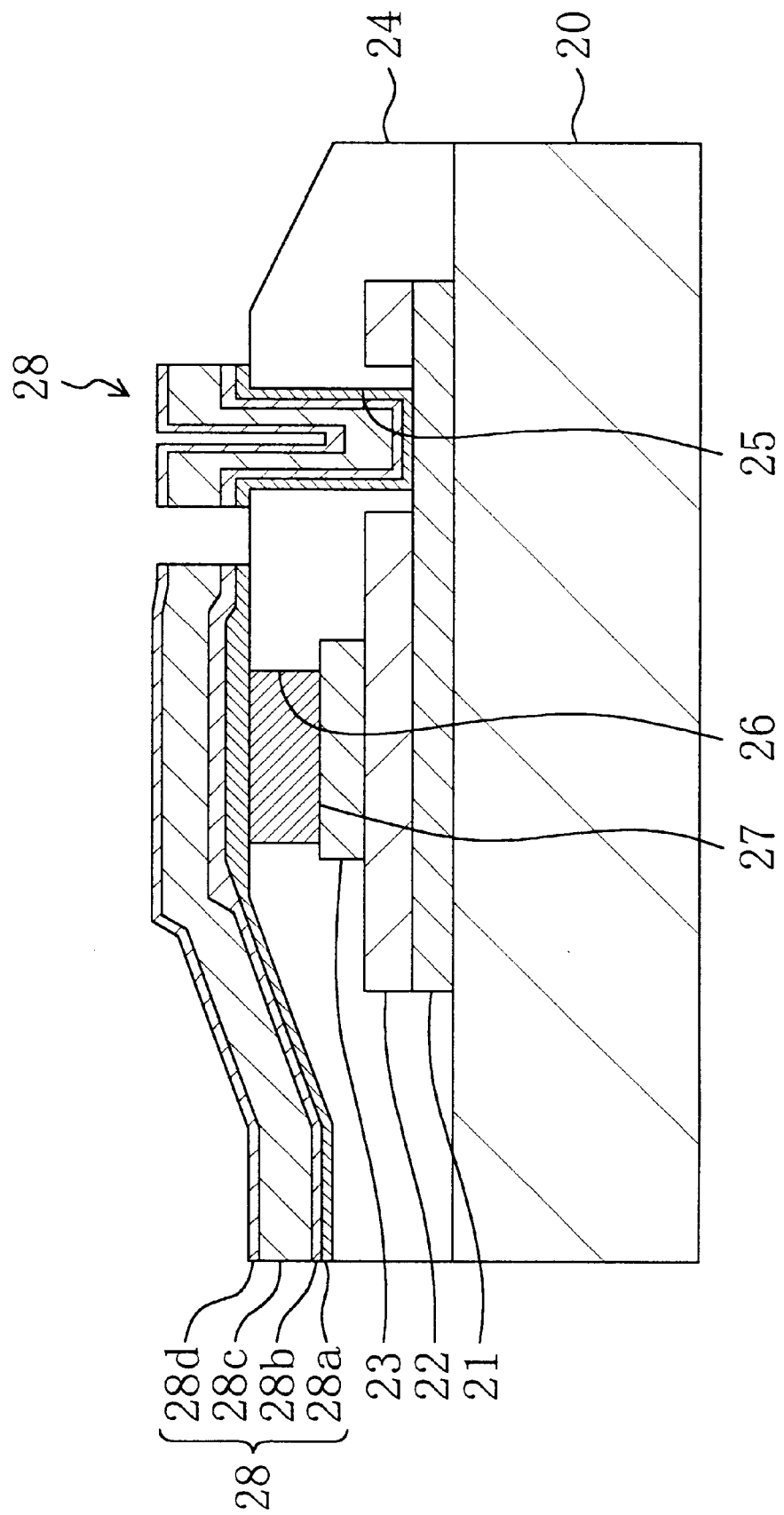
FIG. 2 is a cross-sectional view of a semiconductor device in the second embodiment of the present invention.

FIG. 2 illustrates a cross-sectional structure of the semiconductor device in the second embodiment. As shown in FIG. 2, a lower electrode 21 made of a first platinum film, a capacitive insulating film 22 made of an insulating metal oxide film such as a ferroelectric film or a high dielectric film, and an upper electrode 23 made of a second platinum film are sequentially formed on a semiconductor substrate 20 made of silicon. The lower electrode 21, the capacitive insulating film 22 and the upper electrode 23 constitute a capacitor device.

An interlevel insulating film 24 made of a silicon oxide film, for example, is deposited to cover the entire surface of the semiconductor substrate 20 as well as the capacitor device. A lower-electrode contact hole 25 and an upper-electrode contact hole 26 are formed through the interlevel insulating film 24.

The second embodiment is characterized in that an anti-diffusion conductive film 27 made of a titanium nitride film is filled in the upper-electrode contact hole 26.

Metal interconnections 28, each consisting of a titanium film 28a, a first titanium nitride film 28b, an aluminum film 28c and a second titanium nitride film 28d, are formed so as to cover the interlevel insulating film 24 as well as the inner surfaces of the lower-electrode contact hole 25. In this embodiment, one of the metal interconnections 28 is electrically connected to the lower electrode 21 directly inside the lower-electrode contact hole 25. The other metal interconnection 28 is electrically connected to the upper electrode 23 via the anti-diffusion conductive film 27 above the upper-electrode contact hole 26. In other words, the latter metal interconnection 28 is electrically connected to the upper electrode 23 without being bent in the vertical direction. Thus, the latter metal interconnection 28 can be electrically connected to the upper electrode 23 with more certainty.

Hereinafter, a semiconductor device according to a variation of the second embodiment of the present invention will be described with reference to FIG. 3.

Figure 3:
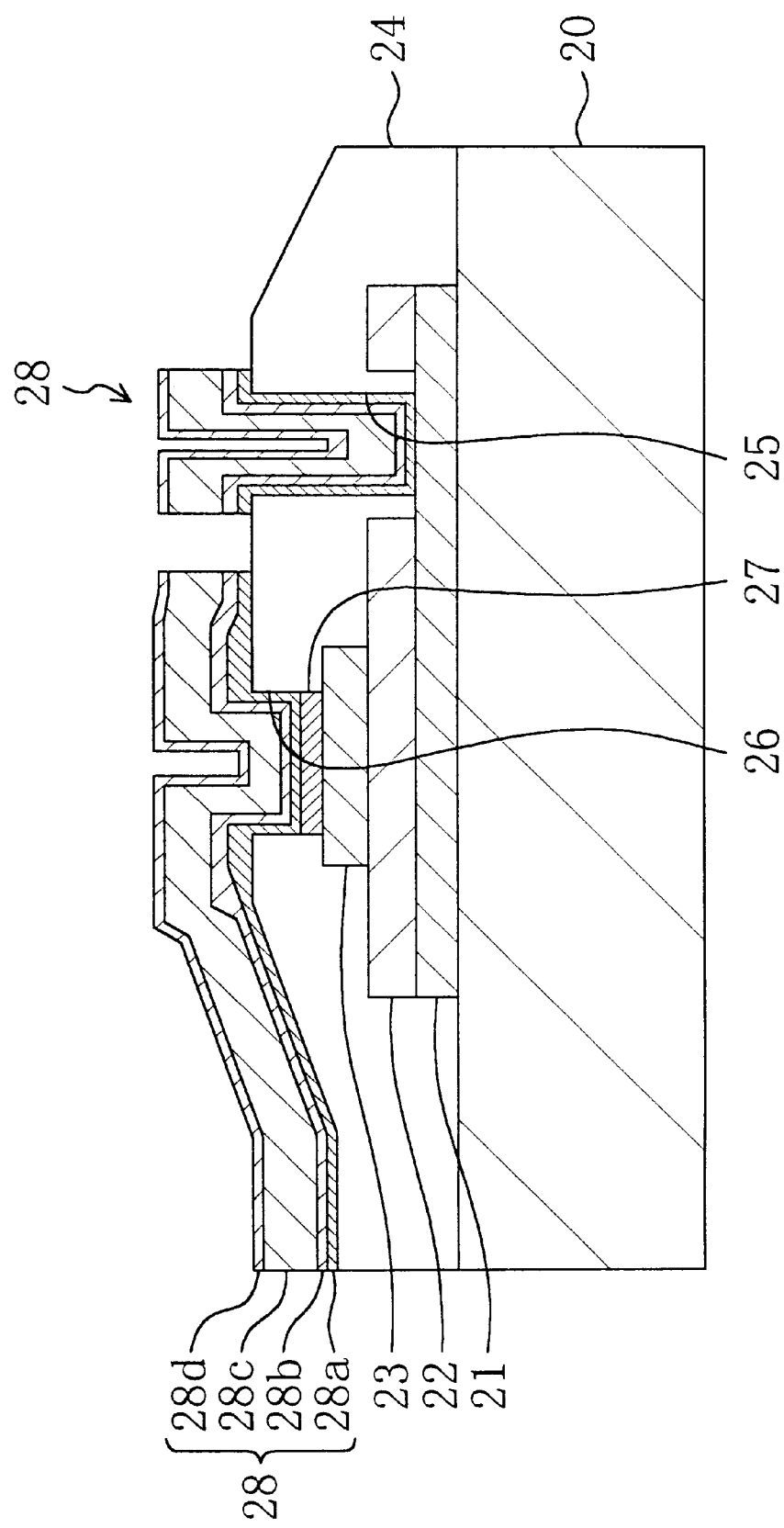
FIG. 3 is a cross-sectional view of a semiconductor device in a variation of the second embodiment of the present invention.

FIG. 3 illustrates a cross-sectional structure of the semiconductor device in the variation of the second embodiment. Only the difference between the second embodiment and this variation will be described below.

The variation of the second embodiment is characterized in that the anti-diffusion conductive film 27 made of a titanium nitride film, for example, is deposited only in the lower part inside the upper-electrode contact hole 26. Thus, part of the metal interconnection 28 consisting of the titanium film 28a, the first titanium nitride film 28b, the aluminum film 28c and the second titanium nitride film 28d is located inside the upper-electrode contact hole 26. Accordingly, one of the metal interconnections 28 is electrically connected to the lower electrode 21 directly inside the lower-electrode contact hole 25. The other metal interconnection 28 is electrically connected to the upper electrode 23 via the anti-diffusion conductive film 27 inside the upper-electrode contact hole 26.

Hereinafter, a method for fabricating the semiconductor device in the second embodiment of the present invention will be described with reference to FIGS. 8(a) through 8(c) and FIGS. 9(a) through 9(c).

Figure 8A:
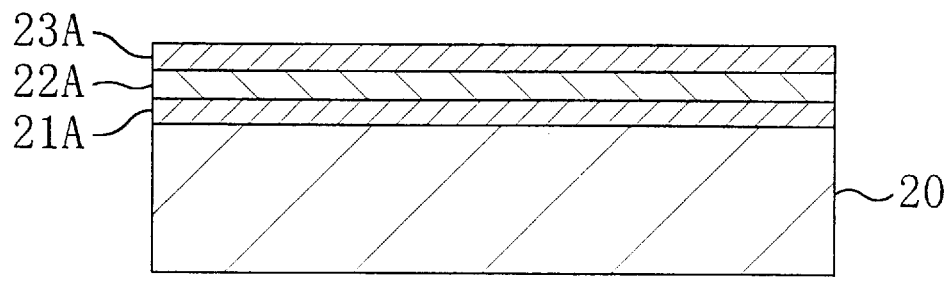
FIGS. 8(a) through 8(c) are cross-sectional views illustrating respective process steps in a method for fabricating the semiconductor device of the second embodiment of the present invention.

First, as shown in FIG. 8(a), the first platinum film 21A, the ferroelectric film 22A and the second platinum film 23A are sequentially stacked over the entire surface of the semiconductor substrate 20.

Figure 8B:
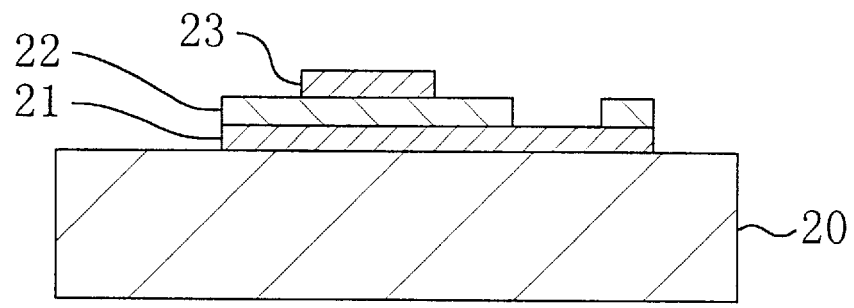

Thereafter, as shown in FIG. 8(b), the second platinum film 23A is selectively etched, thereby forming the upper electrode 23. Then, the ferroelectric film 22A and the first platinum film 21A are selectively etched, thereby forming the capacitive insulating film 22 out of the ferroelectric film 22A and the lower electrode 21 out of the first platinum film 21A. Then, the capacitive insulating film 22 is selectively etched in order to form a region from which a metal interconnection to be electrically connected to the lower electrode 21 is extended upward. Subsequently, in order to recover and stabilize the crystal structure of the ferroelectric film constituting the capacitive insulating film 22, the capacitive insulating film 22 is subjected to a heat treatment within oxygen ambient.

Figure 8C:
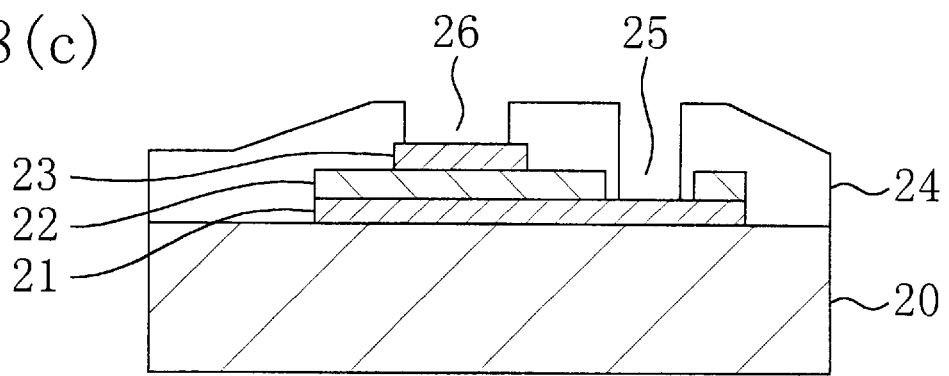

Next, as shown in FIG. 8(c), the interlevel insulating film 24 made of a silicon oxide film is deposited over the entire surface of the semiconductor substrate 20. And the interlevel insulating film 24 is selectively etched, thereby forming the lower-electrode contact hole 25 and the upper-electrode contact hole 26. Then, in order to recover and stabilize the crystal structure of the ferroelectric film constituting the capacitive insulating film 22, the capacitive insulating film 22 is subjected to a heat treatment within oxygen ambient.

Figure 9A:
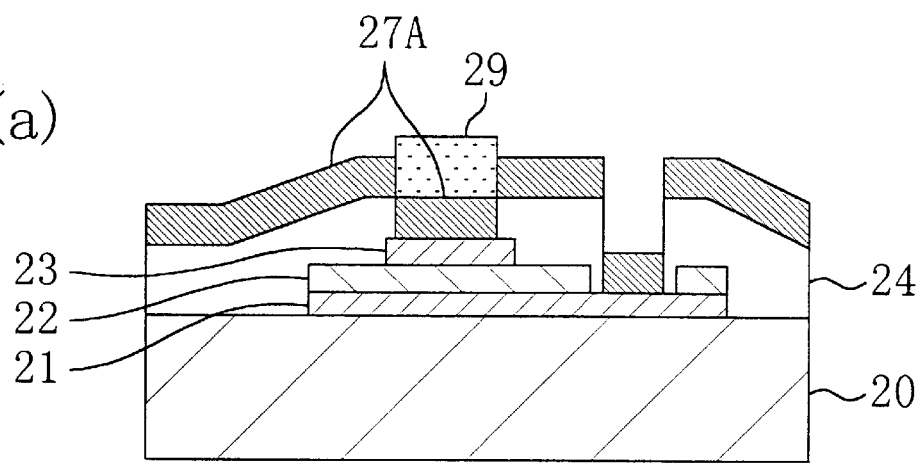
FIGS. 9(a) through 9(c) are cross-sectional views illustrating respective process steps in the method for fabricating the semiconductor device of the second embodiment of the present invention.

Thereafter, as shown in FIG. 9(a), a resist pattern 29 having an opening in a region corresponding to the upper-electrode contact hole 26 is formed over the interlevel insulating film 24 and the titanium nitride film 27A is deposited over the entire surface of the semiconductor substrate 20.

Figure 9B:
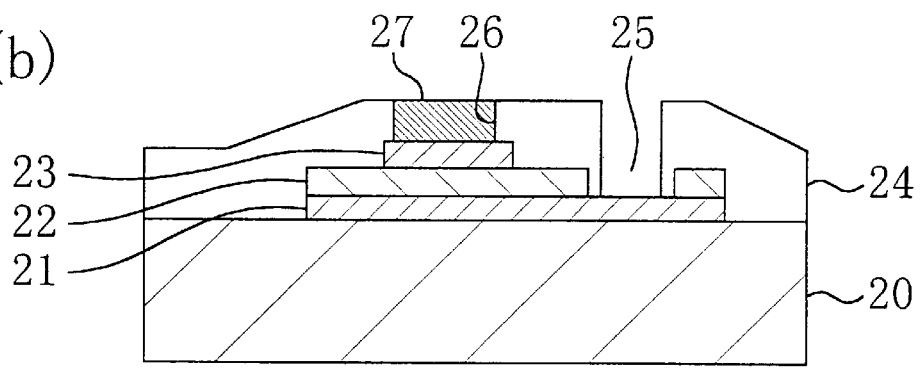

Subsequently, as shown in FIG. 9(b), the resist pattern 29 is removed and the titanium nitride film 27A deposited on the resist pattern 29 is lifted off, thereby forming the anti-diffusion conductive film 27 out of the titanium nitride film 27A so as to fill in only the inside of the upper-electrode contact hole 26.

Figure 9C:
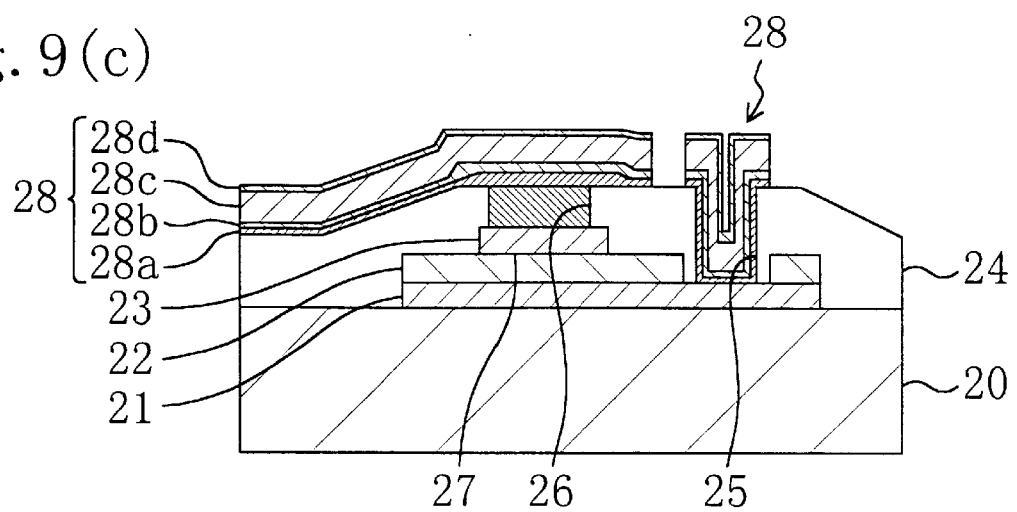

Then, as shown in FIG. 9(c), the metal interconnections 28, each consisting of the titanium film 28a, the first titanium nitride film 28b, the aluminum film 28c and the second titanium nitride film 28d, are formed over the anti-diffusion conductive film 27 and the interlevel insulating film 24. Next, in order to further improve the adhesion between the titanium film 28a constituting the metal interconnections 28 and the interlevel insulating film 24, the metal interconnections 28 are subjected to a heat treatment.

In the second embodiment and the variation thereof, the anti-diffusion conductive film 27 made of the titanium nitride film 27A including no grain boundaries and having a dense structure is formed inside the upper-electrode contact hole 26. Thus, the titanium atoms in the titanium film 28a constituting the metal interconnections 28 do not pass through the anti-diffusion conductive film 27. Accordingly, during the heat treatment conducted on the metal interconnections 28, it is possible to prevent the titanium atoms in the titanium film 28a from passing through the grain boundaries of metal crystals composing the upper electrode 23 and diffusing into the capacitive insulating film 22. As a result, in the second embodiment and the variation thereof, a semi-conductor device including a highly reliable capacitor device can be formed.

In addition, in the second embodiment, since the anti-diffusion conductive film 27 is filled in the upper-electrode contact hole 26, the metal interconnection 28 is not bent over the upper-electrode contact hole 26. Thus, the contact between the metal interconnection 28 and the upper electrode 23 is satisfactory.

Hereinafter, the evaluation of the semiconductor device of the second embodiment will be described.

Table 2 shows in comparison the characteristics of the capacitor device in the semiconductor device of the second embodiment and the characteristics of a capacitor device in a conventional semiconductor device.

TABLE 2

|  | Breakdown voltage (V) | Data retention time (years) |
| --- | --- | --- |
| Second Embodiment | 40 | 10 |
| Conventional Capacitor | 20 | 1 |

As can be understood from Table 2, in the second embodiment, the breakdown voltage of the capacitor device is 40 V, which is twice as high as that of the conventional capacitor device. The data retention time of the capacitor device of the second embodiment is 10 years, which is ten times as long as that of the conventional capacitor device.

Embodiment 3

Hereinafter, a semiconductor device according to the third embodiment of the present invention will be described with reference to FIG. 4.

Figure 4:
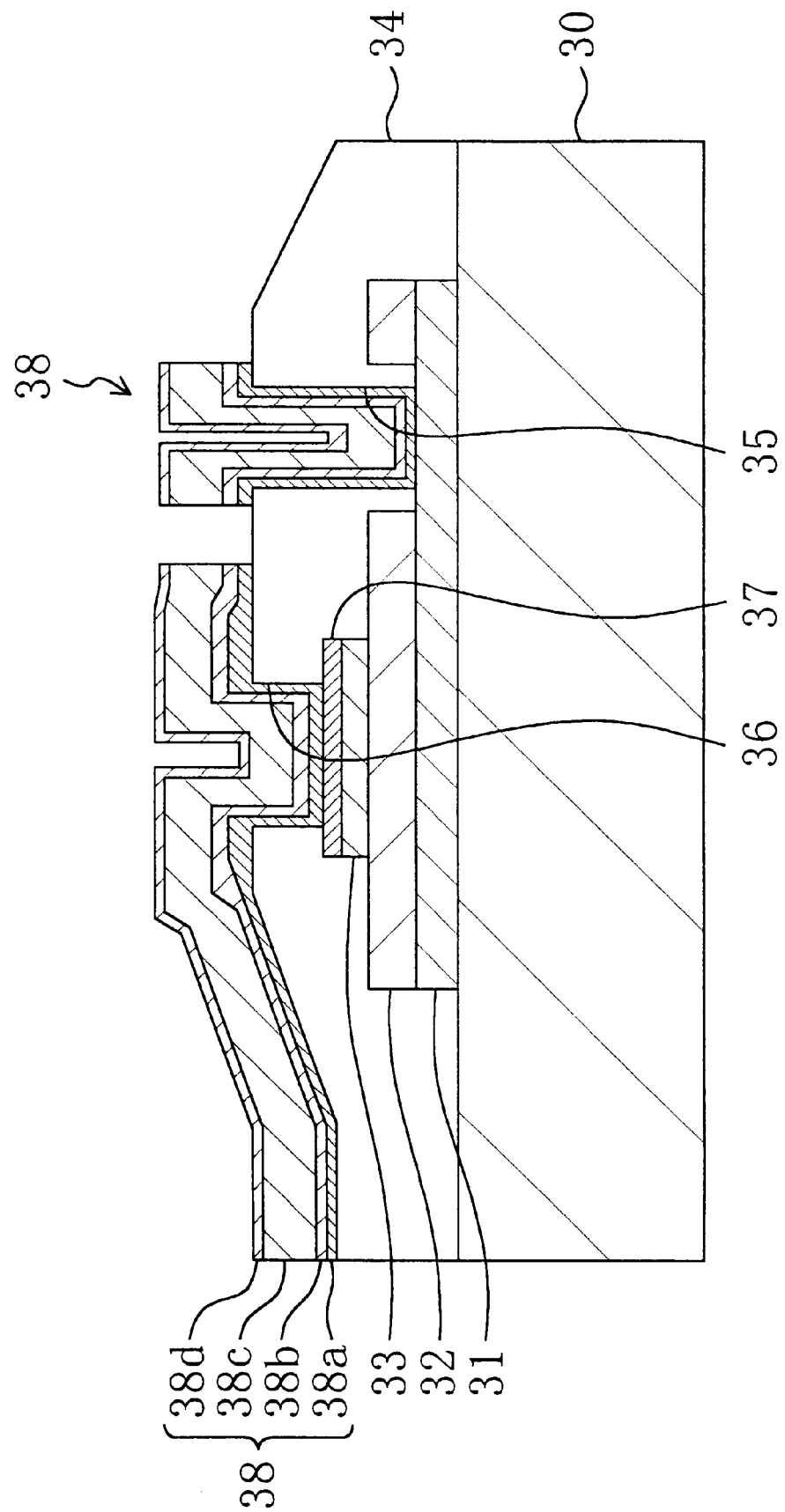
FIG. 4 is a cross-sectional view of a semiconductor device in the third embodiment of the present invention.

FIG. 4 illustrates a cross-sectional structure of the semiconductor device in the third embodiment. As shown in FIG. 4, a lower electrode 31 made of a first platinum film, a capacitive insulating film 32 made of an insulating metal oxide film such as a ferroelectric film or a high dielectric film, and an upper electrode 33 made of a second platinum film are sequentially formed on a semiconductor substrate 30 made of silicon. The lower electrode 31, the capacitive insulating film 32 and the upper electrode 33 constitute a capacitor device.

An interlevel insulating film 34 made of a silicon oxide film, a silicon nitride film or the like, is deposited to cover the entire surface of the semiconductor substrate 30 as well as the capacitor device. A lower-electrode contact hole 35 and an upper-electrode contact hole 36 are formed through the interlevel insulating film 34.

The third embodiment is characterized in that an anti-diffusion conductive film 37 made of a titanium nitride film having the same planar shape as that of the upper electrode 33 is formed on the upper electrode 33.

Metal interconnections 38, each consisting of a titanium film 38a, a first titanium nitride film 38b, an aluminum film 38c and a second titanium nitride film 38d, are formed to cover the interlevel insulating film 34 as well as the inner surfaces of the lower-electrode contact hole 35 and the upper-electrode contact hole 36. In this embodiment, one of the metal interconnections 38 is electrically connected to the lower electrode 31 directly inside the lower-electrode contact hole 35. The other metal interconnection 38 is electrically connected to the upper electrode 33 at the bottom of the upper-electrode contact hole 36 via the anti-diffusion conductive film 37.

Hereinafter, a method for fabricating the semiconductor device in the third embodiment of the present invention will be described with reference to FIGS. 10(a) through 10(e).

Figure 10A:
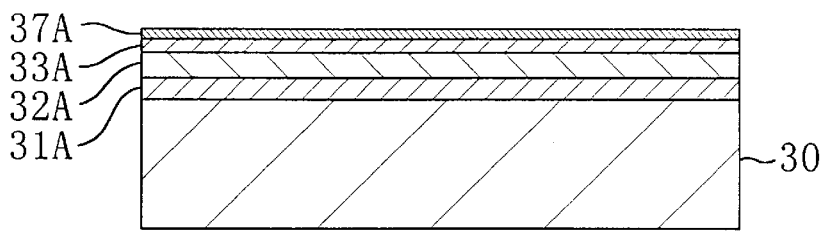
FIGS. 10(a) through 10(e) are cross-sectional views illustrating respective process steps in a method for fabricating the semiconductor device of the third embodiment of the present invention.

First, as shown in FIG. 10(a), the first platinum film 31A, the ferroelectric film 32A, the second platinum film 33A and the titanium nitride film 37A are sequentially stacked over the entire surface of the semiconductor substrate 30.

Figure 10B:
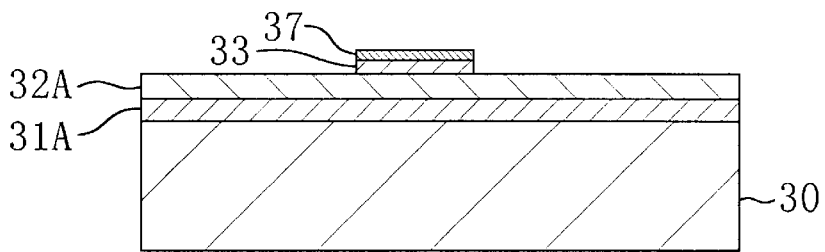

Thereafter, as shown in FIG. 10(b), the titanium nitride film 37A and the second platinum film 33A are patterned by using the same etching mask, thereby forming the anti-diffusion conductive film 37 out of the titanium nitride film 37A and the upper electrode 33 out of the second platinum film 33A. Subsequently, in order to recover and stabilize the crystal structure of the ferroelectric film 32A, the ferroelectric film 32A is subjected to a heat treatment within oxygen ambient.

Figure 10C:
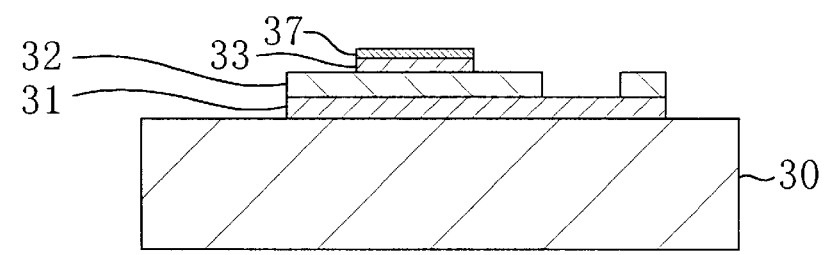

Then, as shown in FIG. 10(c), the ferroelectric film 32A and the first platinum film 31A are patterned, thereby forming the capacitive insulating film 32 out of the ferroelectric film 32A and the lower electrode 31 out of the first platinum film 31A. Thereafter, the capacitive insulating film 32 is selectively etched in order to form a region from which a metal interconnection to be electrically connected to the lower electrode 31 is extended upward. Subsequently, in order to recover and stabilize the crystal structure of the ferroelectric film constituting the capacitive insulating film 32, the capacitive insulating film 32 is subjected to a heat treatment within oxygen ambient.

Figure 10D:
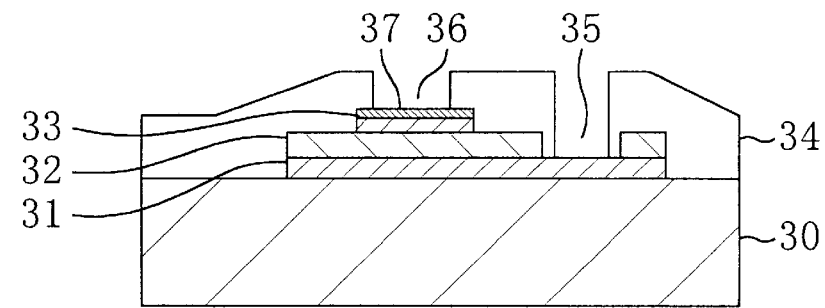

Next, as shown in FIG. 10(d), the interlevel insulating film 34 made of a silicon oxide film is deposited over the entire surface of the semiconductor substrate 30. And the interlevel insulating film 34 is selectively etched, thereby forming the lower-electrode contact hole 35 and the upper-electrode contact hole 36. Then, in order to recover and stabilize the crystal structure of the ferroelectric film constituting the capacitive insulating film 32, the capacitive insulating film 32 is subjected to a heat treatment within oxygen ambient.

Figure 10E:
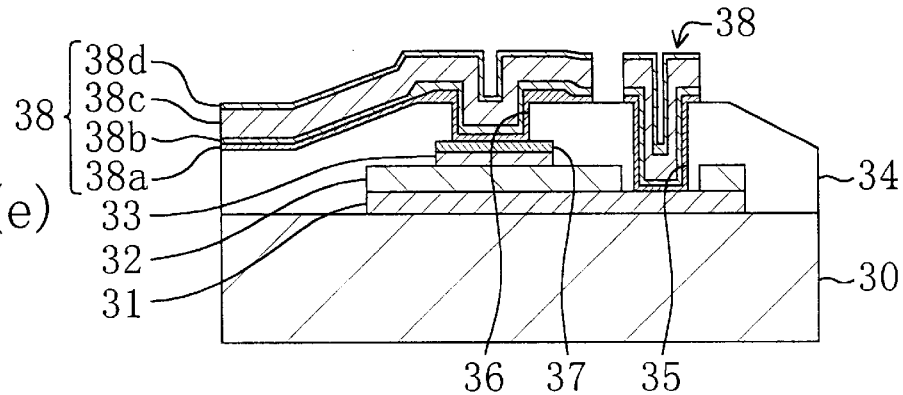

Next, as shown in FIG. 10(e), the metal interconnections 38, each consisting of the titanium film 38a, the first titanium nitride film 38b, the aluminum film 38c and the second titanium nitride film 38d, are formed over the anti-diffusion conductive film 37 and the interlevel insulating film 34. Then, in order to further improve the adhesion between the titanium film 38a constituting the metal interconnections 38 and the interlevel insulating film 34, the metal interconnections 38 are subjected to a heat treatment.

In the third embodiment, the anti-diffusion conductive film 37 made of the titanium nitride film 37A including no grain boundaries and having a dense structure is formed under the bottom of the upper-electrode contact hole 36. Thus, the titanium atoms in the titanium film 38a constituting the metal interconnection 38 do not pass through the anti-diffusion conductive film 37. Accordingly, during the heat treatment conducted on the metal interconnections 38, it is possible to prevent the titanium atoms in the titanium film 38a from passing through the grain boundaries of metal crystals composing the upper electrode 33 and diffusing into the capacitive insulating film 32. As a result, in the third embodiment, a semiconductor device including a highly reliable capacitor device can be formed.

Hereinafter, the evaluation of the semiconductor device of the third embodiment will be described.

Table 3 shows in comparison the characteristics of the capacitor device in the semiconductor device of the third embodiment and the characteristics of a capacitor device in a conventional semiconductor device.

TABLE 3

|  | Breakdown voltage (V) | Data retention time (years) |
| --- | --- | --- |
| Third Embodiment | 40 | 10 |
| Conventional Capacitor | 20 | 1 |

As can be understood from Table 3, in the third embodiment, the breakdown voltage of the capacitor device is 40 V, which is twice as high as that of the conventional capacitor device. The data retention time of the capacitor device of the third embodiment is 10 years, which is ten times as long as that of the conventional capacitor device.

Embodiment 4

Hereinafter, a semiconductor device according to the fourth embodiment of the present invention will be described with reference to FIG. 5.

Figure 5:
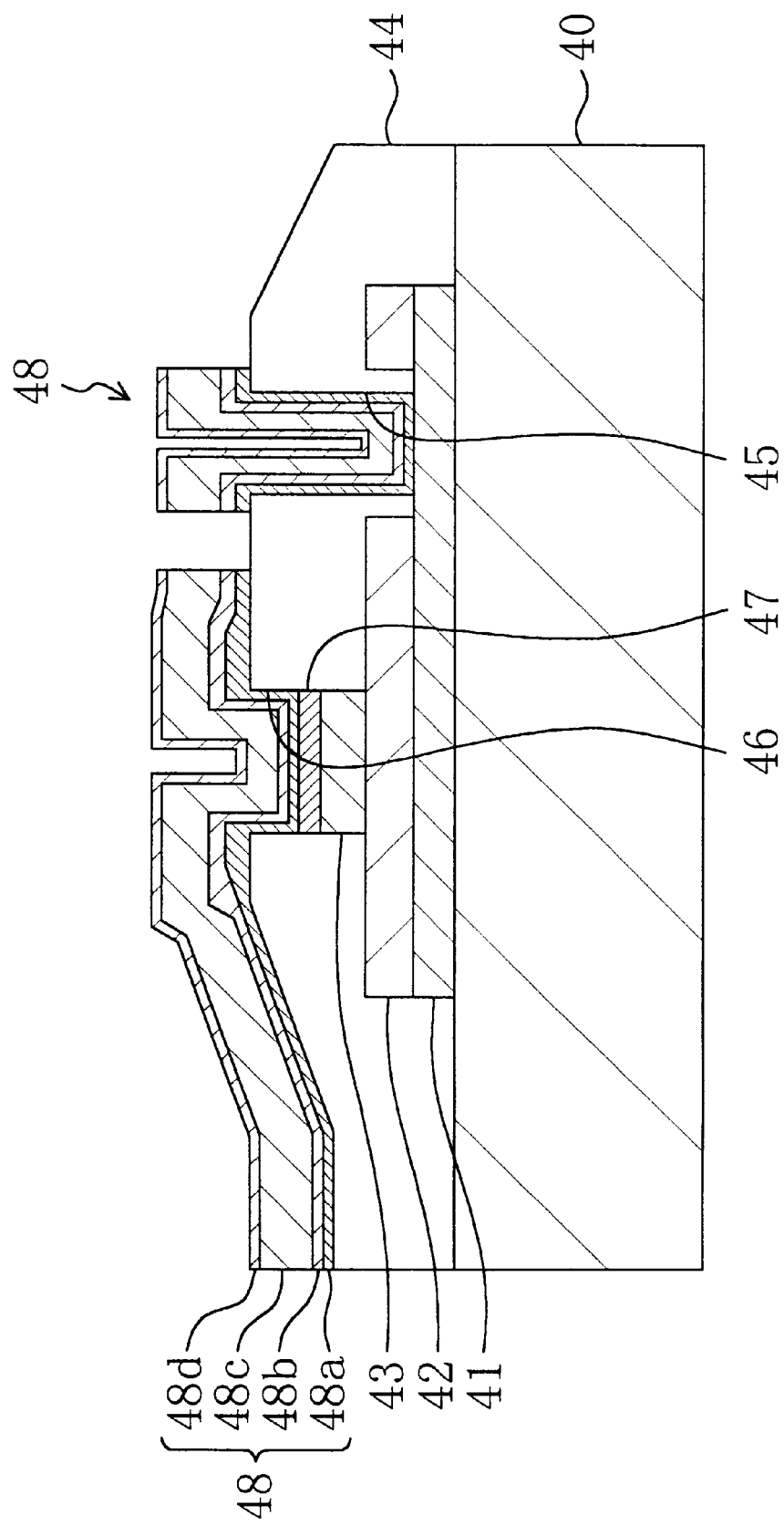
FIG. 5 is a cross-sectional view of a semiconductor device in the fourth embodiment of the present invention.

FIG. 5 illustrates a cross-sectional structure of the semiconductor device in the fourth embodiment. As shown in FIG. 5, a lower electrode 41 made of a first platinum film, a capacitive insulating film 42 made of an insulating metal oxide film such as a ferroelectric film or a high dielectric film, and an upper electrode 43 made of a second platinum film are sequentially formed on a semiconductor substrate 40 made of silicon. The lower electrode 41, the capacitive insulating film 42 and the upper electrode 43 constitute a capacitor device.

An interlevel insulating film 44, made of a silicon oxide film, a silicon nitride film or the like, is deposited to cover the entire surface of the semiconductor substrate 40 as well as the capacitor device. A lower-electrode contact hole 45 and an upper-electrode contact hole 46 are formed through the interlevel insulating film 44.

The fourth embodiment is characterized in that an anti-diffusion conductive film 47 made of a titanium nitride film, for example, is deposited so as to fill in only the lower part inside the lower-electrode contact hole 45 and the lower part inside the upper-electrode contact hole 46.

Metal interconnections 48, each consisting of a titanium film 48a, a first titanium nitride film 48b, an aluminum film 48c and a second titanium nitride film 48d, are formed to cover the interlevel insulating film 44 as well as the inner surfaces of the lower-electrode contact hole 45 and the upper-electrode contact hole 46. In this embodiment, one of the metal interconnections 48 is electrically connected to the lower electrode 41 via the anti-diffusion conductive film 47 inside the lower-electrode contact hole 45. The other metal interconnection 48 is electrically connected to the upper electrode 43 via the anti-diffusion conductive film 47 inside the upper-electrode contact hole 46.

Hereinafter, a method for fabricating the semiconductor device in the fourth embodiment of the present invention will be described with reference to FIGS. 11(a) through 11(c) and FIGS. 12(a) through 12(c).

Figure 11A:
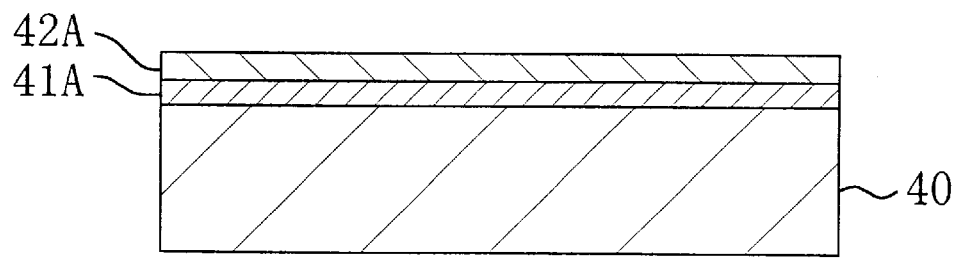
FIGS. 11(a) through 11(c) are cross-sectional views illustrating respective process steps in a method for fabricating the semiconductor device of the fourth embodiment of the present invention.

First, as shown in FIG. 11(a), the first platinum film 41A and the ferroelectric film 42A are sequentially stacked over the entire surface of the semiconductor substrate 40.

Figure 11B:
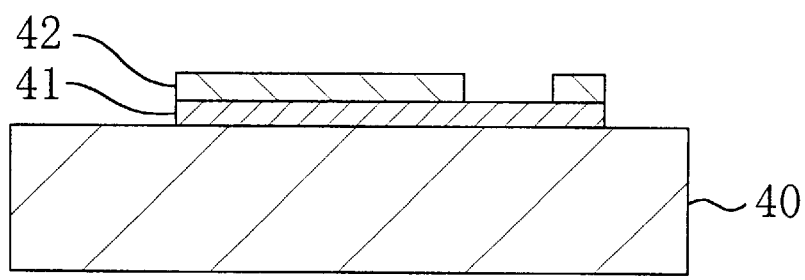

Thereafter, as shown in FIG. 11(b), the ferroelectric film 42A and the first platinum film 41A are selectively etched, thereby forming the capacitive insulating film 42 out of the ferroelectric film 42A and the lower electrode 41 out of the first platinum film 41A. Then, the capacitive insulating film 42 is selectively etched in order to form a region from which a metal interconnection to be electrically connected to the lower electrode 41 is extended upward. Subsequently, in order to recover and stabilize the crystal structure of the ferroelectric film constituting the capacitive insulating film 42, the capacitive insulating film 42 is subjected to a heat treatment within oxygen ambient.

Figure 11C:
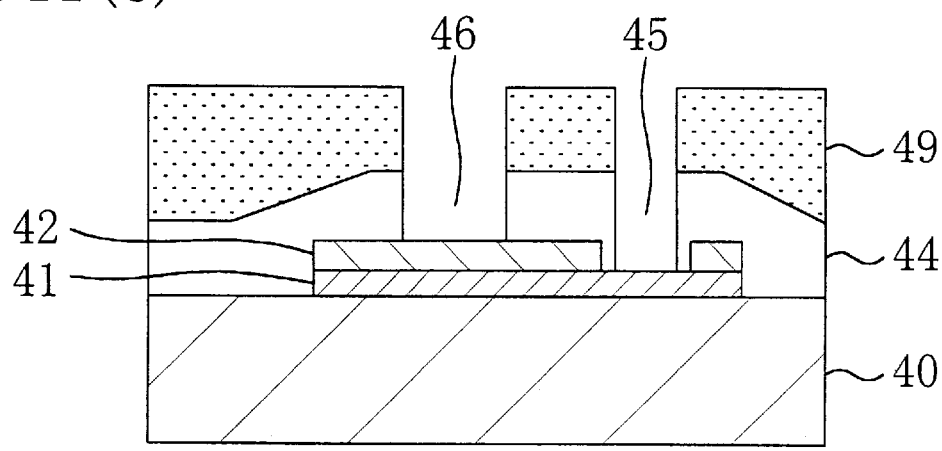

Next, as shown in FIG. 11(c), the interlevel insulating film 44 is deposited over the entire surface of the semiconductor substrate 40. And a resist pattern 49, having openings over the respective regions where the lower-electrode contact hole and the upper-electrode contact hole are to be formed, is formed over the interlevel insulating film 44.

Figure 12A:
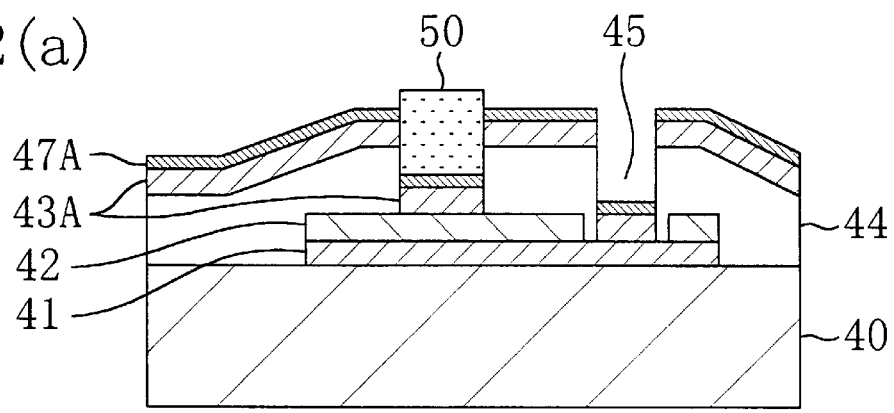
FIGS. 12(a) through 12(c) are cross-sectional views illustrating respective process steps in the method for fabricating the semiconductor device of the fourth embodiment of the present invention.

Then, as shown in FIG. 12(a), the interlevel insulating film 44 is patterned by using the resist pattern 49 as an etching mask, thereby forming the lower-electrode contact hole 45 and the upper-electrode contact hole 46 through the interlevel insulating film 44. Thereafter, the second platinum film 43A and the titanium nitride film 47A are sequentially deposited to cover the entire surface including the inner surfaces of the lower-electrode contact hole 45 and the upper-electrode contact hole 46.

Figure 12B:
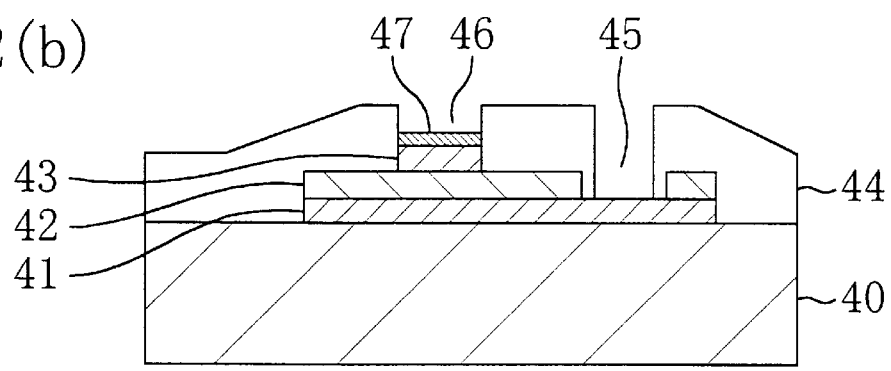

Next, as shown in FIG. 12(b), the resist pattern 49 is removed and the second platinum film 43A and the titanium nitride film 47A deposited on the resist pattern 49 are lifted off, thereby leaving the second platinum film 43A inside the lower-electrode contact hole 45 and forming the anti-diffusion conductive film 47 out of the titanium nitride film 47A thereon. Also, inside the upper-electrode contact hole 46, the upper electrode 43 is formed out of the second platinum film 43A and the anti-diffusion conductive film 47 is formed out of the titanium nitride film 47A.

Figure 12C:
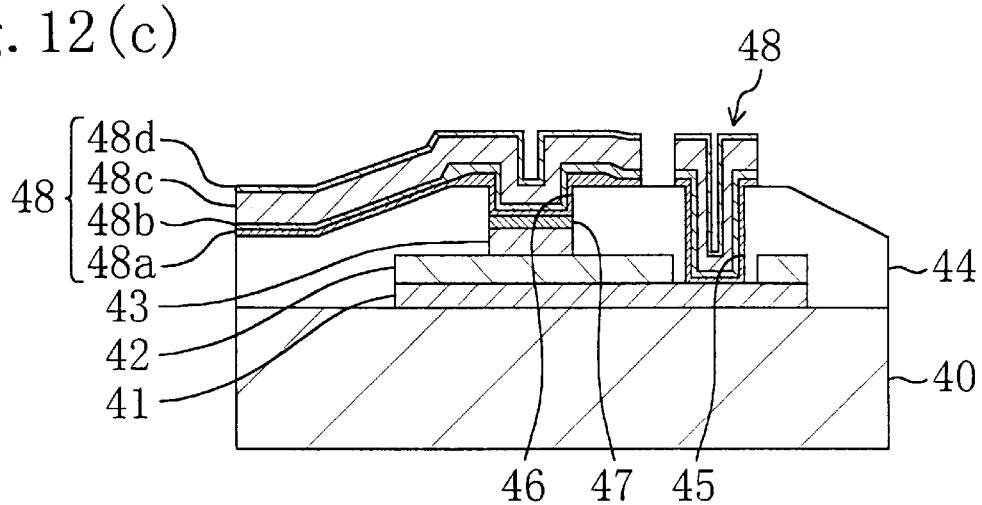
Figure 13:
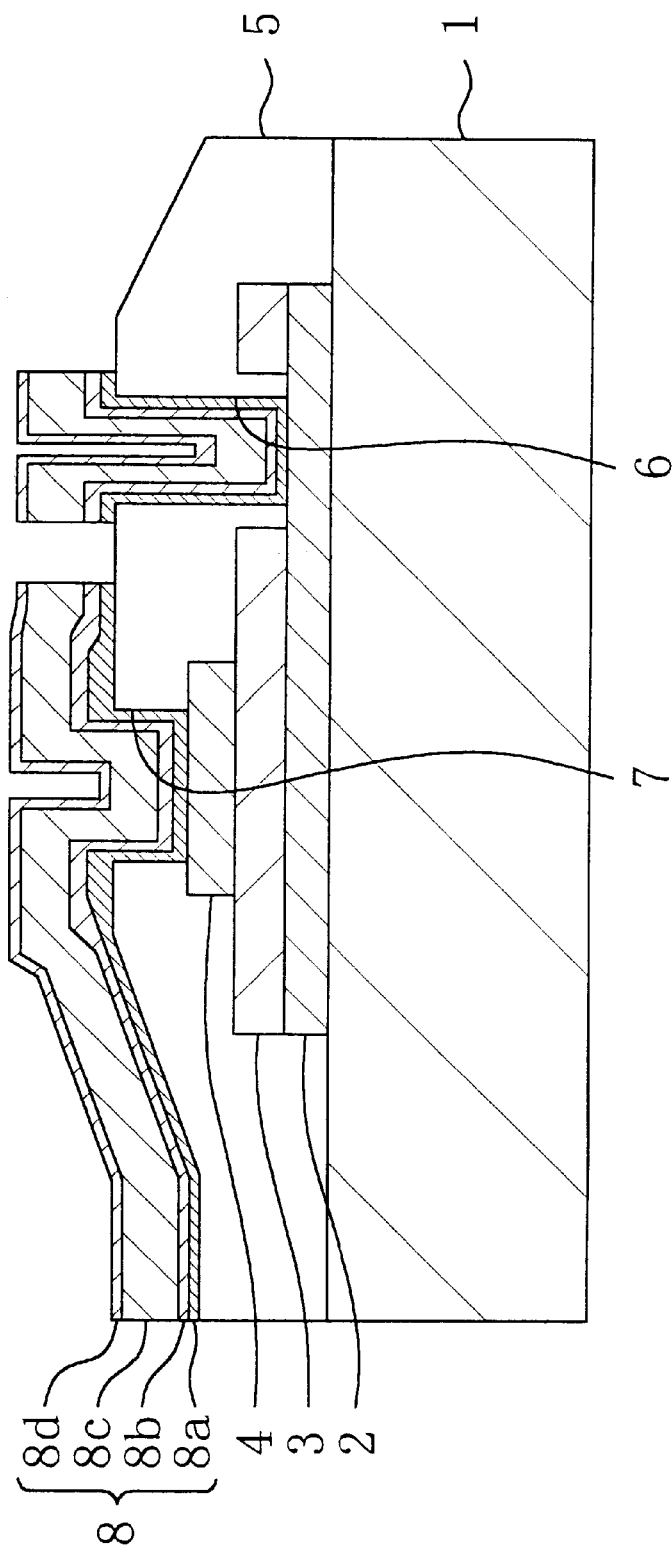
FIG. 13 is a cross-sectional view of a conventional semiconductor device.
Figure 14A:
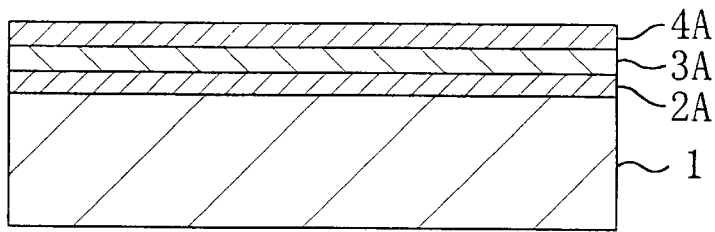
FIGS. 14(a) through 14(e) are cross-sectional views illustrating respective process steps in a conventional method for fabricating a semiconductor device.
Figure 14B:
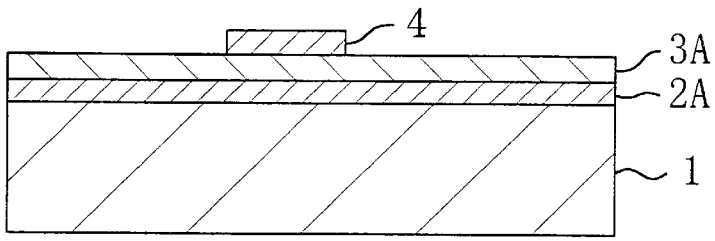
Figure 14C:
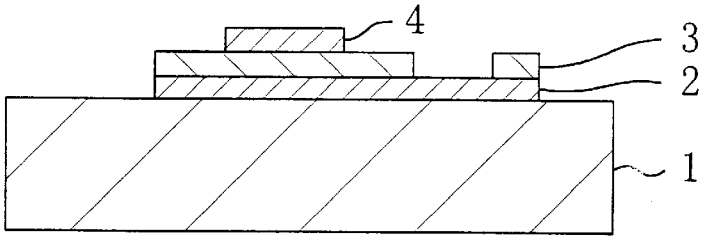
Figure 14D:
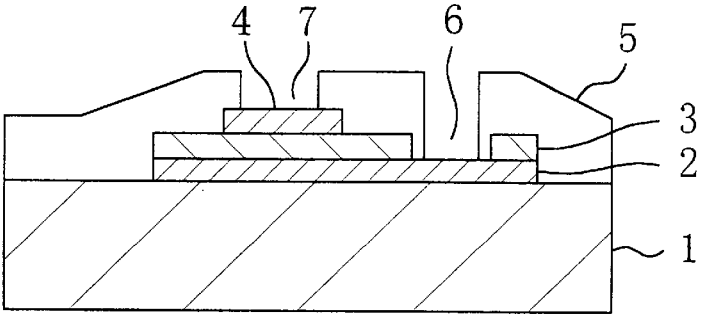
Figure 14E:
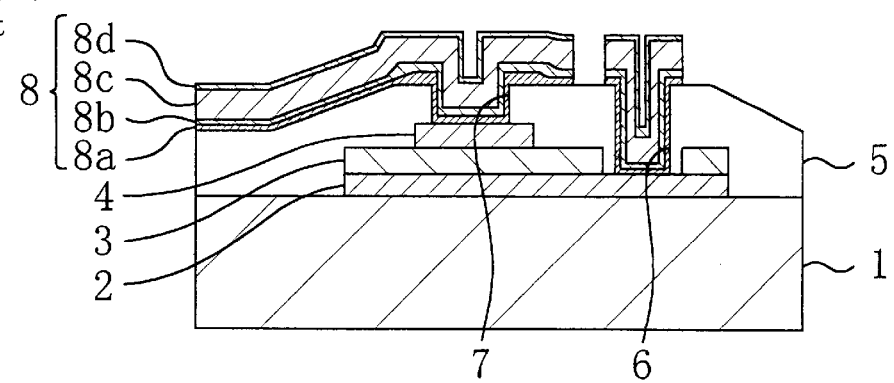

Then, as shown in FIG. 12(c), the metal interconnections 48, each consisting of the titanium film 48a, the first titanium nitride film 48b, the aluminum film 48c and the second titanium nitride film 48d, are formed over the anti-diffusion conductive film 47 and the interlevel insulating film 44. Next, in order to further improve the adhesion between the titanium film 48a constituting the metal interconnections 48 and the interlevel insulating film 44, the metal interconnections 48 are subjected to a heat treatment.

In the fourth embodiment, the anti-diffusion conductive film 47 made of the titanium nitride film 47A including no grain boundaries and having a dense structure is formed inside the upper-electrode contact hole 46. Thus, the titanium atoms in the titanium film 48a constituting the metal interconnections 48 do not pass through the anti-diffusion conductive film 47. Accordingly, during the heat treatment conducted on the metal interconnections 48, it is possible to prevent the titanium atoms in the titanium film 48a from passing through the grain boundaries of metal crystals composing the upper electrode 43 and diffusing into the capacitive insulating film 42. As a result, in the fourth embodiment, a semiconductor device including a highly reliable capacitor device can be formed.

Hereinafter, the evaluation of the semiconductor device of the fourth embodiment will be described.

Table 4 shows in comparison the characteristics of the capacitor device in the semiconductor device of the fourth embodiment and the characteristics of a capacitor device in a conventional semiconductor device.

TABLE 4

|  | Breakdown voltage (V) | Data retention time (years) |
| --- | --- | --- |
| Fourth Embodiment | 40 | 10 |
| Conventional Capacitor | 20 | 1 |

As can be understood from Table 4, in the fourth embodiment, the breakdown voltage of the capacitor device is 40 V, which is twice as high as that of the conventional capacitor device. The data retention time of the capacitor device of the fourth embodiment is 10 years, which is ten times as long as that of the conventional capacitor device.

In the foregoing first to fourth embodiments, a titanium nitride film is used as the anti-diffusion conductive film 17, 27, 37, 47. Alternatively, a metal film made of at least one element selected from the group consisting of tungsten, iridium, tantalum, rhodium, palladium, zirconium, niobium and vanadium; a metal nitride film made of at least one element selected from the group consisting of tungsten, tantalum, zirconium, niobium and vanadium; or a metal oxide film made of at least one element selected from the group consisting of iridium, rhodium, palladium, osmium and ruthenium may be used instead. Since these metal films, metal nitride films and metal oxide films include no grain boundaries and have a dense structure, these films also prevent the passage of titanium atoms in the titanium film composing the metal interconnections 18, 28, 38, 48, in the same way as the titanium nitride film.

If one of the above-enumerated metal oxide film is used as the anti-diffusion conductive film 17, 27, 37, 47, then the conductivity of the metal oxide film is not damaged even when a heat treatment is conducted within oxygen ambient in order to recover and stabilize the crystal structure of the ferroelectric film constituting the capacitive insulating film 12, 22, 32, 42. This is because the metal oxide film has conductivity in the state of an oxide.

Also, a multi-layer structure including at least two types of films selected from the metal films, the metal nitride films and the metal oxide films may be used as the anti-diffusion conductive film 17, 27, 37, 47.

In the first to fourth embodiments, a multi-layer film including a platinum film and an iridium oxide film, instead of the platinum film, may be used as the lower electrode 11, 21, 31, 41 and/or the upper electrode 13, 23, 33, 43.

In the third and fourth embodiments, a plurality of upper electrodes 33, 43 and a plurality of anti-diffusion conductive films 37, 47, each having a small thickness, may be alternately stacked. In such an embodiment, a stable upper electrode, which is very less likely to be deformed because of thermal expansion, can be formed.

In the first to fourth embodiments, a perovskite ferroelectric film made of barium titanate, lead titanate zirconate or the like, or a bismuth layer shaped perovskite ferroelectric film made of $SrBi_2Ta_2O_9$ or the like may be used as the ferroelectric film constituting the capacitive insulating film 12, 22, 32, 42.

Also, if an insulating metal oxide film, such as a high dielectric film, other than the ferroelectric film is used as the capacitive insulating film 12, 22, 32, 42, then the capacitor device may be applied to a dynamic RAM.

In the first to fourth embodiments, a silicon nitride film or a silicon oxynitride film, instead of the silicon oxide film, may be used as the interlevel insulating film 14, 24, 34, 44. The semiconductor substrate 10, 20, 30, 40 may be an insulating substrate (such as a glass substrate), a conductive substrate or a semiconductor substrate on which transistors or the like are formed.

What is claimed is:

1. A semiconductor device comprising:

a substrate;

a capacitor device, which is formed on the substrate and includes a capacitive lower electrode, a capacitive insulating film made of an insulating metal oxide film and a capacitive upper electrode;

an interlevel insulating film, which is formed over the capacitor device and has an opening reaching the capacitive upper electrode;

a metal interconnection, which is formed on the interlevel insulating film so as to be electrically connected to the capacitive upper electrode through the opening and includes a titanium film; and an anti-diffusion film, which is formed between the capacitive upper electrode and the metal interconnection, said anti-diffusion film being conductive and operative for preventing titanium atoms from passing through the capacitive upper electrode and diffusing into the capacitive insulating film.

2. The semiconductor device of claim 1, wherein the anti-diffusion film is a metal nitride film or metal oxide film having conductivity.

3. The semiconductor device of claim 1, wherein the capacitive insulating film is a ferroelectric film or a high dielectric film.

4. The semiconductor device of claim 1, wherein the titanium film is an adhesive layer, formed as a lowermost layer of the metal interconnection, for improving adhesion between the metal interconnection and the upper electrode, and wherein the anti-diffusion film is a titanium nitride film.

5. The semiconductor device of claim 1, wherein the capacitive upper electrode has a crystal structure including a grain boundary.

* * * * *